(12) United States Patent
Lane et al.

(10) Patent No.: US 6,265,282 B1
(45) Date of Patent: *Jul. 24, 2001

(54) PROCESS FOR MAKING AN ISOLATION STRUCTURE

(75) Inventors: Richard Lane, Boise, ID (US); Randhir Thakur, San Jose, CA (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/135,474

(22) Filed: Aug. 17, 1998

(51) Int. Cl.$^7$ .................................................. H01L 21/76
(52) U.S. Cl. ......................... 438/424; 438/296; 438/426
(58) Field of Search ................................... 438/424, 426, 438/296

(56) References Cited

U.S. PATENT DOCUMENTS

| | | | |
|---|---|---|---|
| 4,394,196 | * 7/1983 | Iwai | 438/426 |
| 4,942,137 | * 7/1990 | Sivan et al. | 438/424 |
| 5,258,332 | * 11/1993 | Horioka et al. | 438/424 |
| 5,470,781 | 11/1995 | Chidambarrao et al. | 437/68 |
| 5,578,518 | * 11/1996 | Koike et al. | 438/424 |
| 5,712,185 | * 1/1998 | Tsai et al. | 438/424 |
| 5,719,085 | * 2/1998 | Moon et al. | 438/424 |
| 5,766,823 | * 6/1998 | Fumitomo | 438/314 |
| 5,780,346 | * 7/1998 | Arghavani et al. | 438/296 |
| 5,837,612 | * 11/1998 | Ajuria et al. | 438/426 |
| 5,858,857 | * 1/1999 | Ho | 438/424 |
| 5,863,827 | * 1/1999 | Joyner | 438/424 |
| 5,880,004 | * 3/1999 | Ho | 438/421 |
| 5,923,993 | * 7/1999 | Sahota | 438/427 |
| 6,048,771 | * 4/2000 | Lin et al. | 438/296 |

OTHER PUBLICATIONS

Stanley Wolf Silicon Processing for the VSLI ERA vol. 3 Lattice Press pp. 366 and 340, 1995.*

"A Novel 0.25 μm Shallow Trench Isolation Technology" by C. Chen, J. W. Chou, W. Lur, and S. W. Sun, United Microelectronics Corp., Advanced Technology Development Department, Science–Based Industrial Park, Hsin–Chu, Taiwan, ROC.

"A Highly Manufacturable Trench Isolation Process for Deep Submicron DRAMS" by Pierre C. Fazan and Viju K. Mathews, Micron Semiconductor, Inc., 1993, 3.6.1–3.6.4.

"Ultranarrow Trench–isolated 0.2–μm CMOS and its Application to Ultralow–power Frequency Dividers", H. Inokawa, Y. Yamamoto, Y. Okazaki, T. Kobayashi, M. Miyake and H. Ishii, 1993, 36.3.1–36.3.4.

Stanley Wolf Silicon Processing for the VLSI ERA vol. 3 Lattice press p. 337, 1995.*

Daniel Ehrlich Emerging Tecnologies for in situ Processing Proceedings of NATO workshop 5/98 Nijoff puplishers, 1998.*

* cited by examiner

Primary Examiner—Charles Bowers
Assistant Examiner—David S Blum
(74) Attorney, Agent, or Firm—Schwegman, Lundberg, Woessner & Kluth, P.A.

(57) ABSTRACT

A novel shallow-trench isolation (STI) structure and process for forming it is described. More particularly, a recess is formed in a semiconductor substrate. An oxide layer is formed in the recess using thermal oxidation or high-pressure oxidation. If the oxide layer is formed by high-pressure oxidation, then a nitrogen containing gas may be flowed into a high-pressure oxidation chamber to add nitrogen to the oxide layer. The recess may then be filled with a dielectric layer by a deposition process. Alternately, the dielectric layer may be formed using high-pressure oxidation.

58 Claims, 4 Drawing Sheets

PROCESS FOR MAKING AN ISOLATION STRUCTURE

TECHNICAL FIELD OF THE INVENTION

The present invention generally relates to an isolation structure for semiconductor devices, and more particularly relates to a shallow-trench isolation (STI) structure.

BACKGROUND OF THE INVENTION

As semiconductor technologies evolve, some conventional approaches for forming quarter (0.25) micron and smaller features become more problematic. One such example is local oxidation of silicon (LOCOS) for forming field oxide regions in an array of memory integrated circuit cells. In LOCOS, a nitride hard mask is patterned to cover designated active areas on a silicon substrate. During LOCOS oxidation of exposed field regions of the silicon substrate, the nitride hard mask deflects upwardly at the interface of field regions and active areas owing to encroachment of the LOCOS under the mask (i.e., encroachment into the active areas). Additionally, LOCOS formation is inherently nonplanar, which makes it relatively difficult for use in 0.25 micron or smaller geometries in large-scale integration for isolating one device from another.

Consequently, shallow-trench isolation (STI) has been suggested as a practical alternative to LOCOS for 0.25 micron and smaller topographies. With STI, a more planar structure may be achieved, especially when compared with semi-recessed LOCOS. For example, an STI structure may be planarized by subsequent etch back or chemical-mechanical polishing (CMP) to form an optimally planar surface.

A problem with STI is that a recess in an STI field oxide near an active area edge causes sub-threshold voltage conduction (leakage current) across a metal-oxide-semiconductor-field-effect-transistor (MOSFET) adjacent to a defective STI structure. It is believed that the field oxide recess causes field crowding at the active area edge of the trench leading to sub-threshold conduction. Such a recess may be caused by over polishing during CMP or deglazing.

To address this problem, others have suggested that a gate oxide be grown prior to forming an STI trench. The formed trench is then filled with an oxide. A CMP step is employed to form a surface of the field oxide planar to the deposited gate oxide (i.e., above the silicon wafer surface). Accordingly, this process avoids a field oxide recess near a gate edge and a field edge of an adjacent transistor. However, this process necessitates forming a gate oxide early, which is then subjected to subsequent processing steps which may adversely impact the quality or the integrity of the gate oxide.

Accordingly, it would be desirable to provide an STI structure that provides less probability of leakage current. Moreover, it would be desirable to provide a process which reduces probability of subthreshold voltage transistor leakage, but which also allows for gate formation later in the process.

SUMMARY OF THE INVENTION

The present invention provides structure for isolating one integrated circuit from another and method for forming an isolation structure. More particularly, an STI structure in accordance with the present invention may be employed for electrically isolating a plurality of devices in an integrated circuit from one another.

In accordance with the present invention, a base material member, such as a semiconductor substrate, has one or more recesses formed about a surface of the member. Pitch or spacing of these recesses may be determined at least in part by circuit requirements and process equipment limitations. An oxide layer is formed in the recesses. The oxide layer may be formed by one or more sub-layers, and may be formed by high-pressure oxidation (HIPOX) or by thermal oxidation. Notably, use of HIPOX facilitates oxidation more readily along the bottom, as opposed to the sidewalls, of a recess, and thus aspect ratio is improved for any subsequent deposition to fill the recess.

In the HIPOX embodiment, impurities (e.g., dopants) may be implanted in the semiconductor substrate at the bottom of the recess prior to formation of the oxide layer. This implanting may be used to aid subsequent oxidation. In the HIPOX embodiment, nitrogen may be flowed into a HIPOX chamber to form at least a part of the oxide layer. Any remaining vacancies in the recesses may be filled with a dielectric material.

The dielectric material may be deposited, for example, as a layer over the base member. An unwanted portion of the dielectric material may be removed by etching or by polishing. A portion of the dielectric material may be provided to and remain on an upper surface of the base member to provide a dielectric layer for forming a portion of an integrated circuit device, such as a gate oxide for a transistor or a dielectric for a capacitor.

It is a desired goal that the present invention provide improved isolation by providing a sub-liner layer of a high quality oxide.

BRIEF DESCRIPTION OF THE DRAWING(S)

Features and advantages of the present invention will become more apparent from the following detailed description of the preferred embodiment(s) described below in detail with reference to the accompanying drawings where.

Reference numbers refer to the same or equivalent parts of embodiment(s) of the present invention throughout the several figures of the drawing.

DETAILED DESCRIPTION OF THE PREFERRED EMBODIMENT(S)

Figure 1:
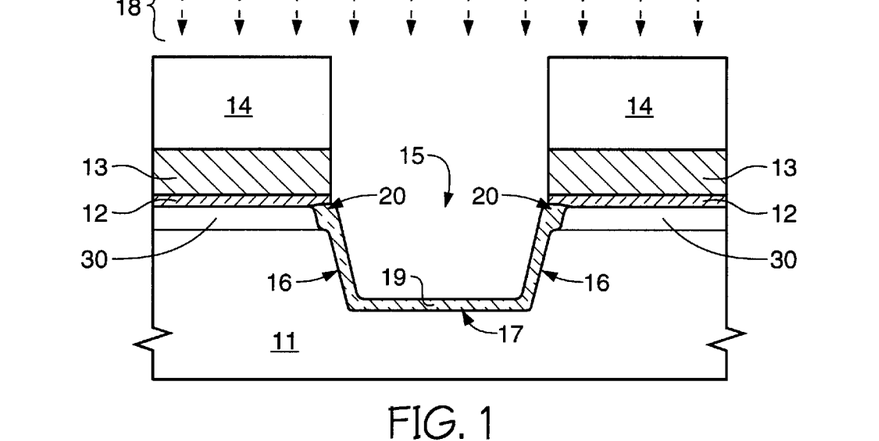
FIG. 1 is a cross-sectional view of an exemplary portion of an embodiment of an in-process shallow trench isolation (STI) structure in accordance with the present invention.

Referring to FIG. 1, there is shown a cross-sectional view of an exemplary portion of an embodiment of an in-process shallow trench isolation (STI) structure in accordance with the present invention. Substrate 11 has a first dielectric layer 12 formed thereon. Layer 12 may be a thermally grown oxide, such as a transistor gate oxide. A second dielectric layer 13 is formed on layer 12. Layer 13 may be a nitride or dielectric antireflective coating (DARC) layer. On layer 13 is mask layer 14. Mask layer 14 may be a resist used in microlithography. Layers 12, 13, and 14 do not form part of such an STI structure.

Layer 14 is patterned to expose regions for forming recess ("trench") 15. By trench, it is meant to include any recessed contour, such as a hole, groove, and the like. Moreover, by substrate, it is meant to include any semiconductor layer, and by substrate assembly, it is meant to include any substrate having one or more layers formed thereon or doped regions formed therein.

Trench 15 includes sidewall ("sidewalls") 16 and bottom surface 17. While trench 15 is shown with sloped or tapered sidewalls 16, it may be formed by an anisotropic etch to form vertical sidewalls. However, sloped sidewalls 16 facilitate filling of trench 15.

Optionally, a doping or damaging implant 18 may be used after etching trench 15. Such implantation facilitates an increased rate of oxidation for subsequent processing. This may be advantageous for subsequent filling, especially with respect to using sloped sidewalls 16, which are subject to a vertical implant. For if oxidation occurs more readily along bottom surface 14 and sidewalls 13 in forming layer 19, then less volume in trench 15 needs to be filled. If implant 18 is used, HIPOX processing may optionally be sustained to further fill trench 15 with the formation of layer 19. Layer 19 is at least about 100 angstroms thick ($1 \times 10^{-8}$ meters), and preferably in a range of about 100 to 250 angstroms thick.

Layer 19 is formed at least in part in trench 15. Layer 19 may be formed by thermal oxidation or by high-pressure oxidation (HIPOX).

HIPOX

In the HIPOX embodiment for forming layer 19, pressure in a range of about 2 to 200 atmospheres and temperature of at least about 650 degrees Celsius may be used. However, the preferred conditions are pressure in a range of about 10 to 25 atmospheres and temperature in a range of about 850 to 1050 degrees Celsius. In this embodiment, silicon dioxide ($SiO_2$) layer 19 is formed in a HIPOX chamber, where oxygen ($O_2$) is introduced at a pressure of about 10 atmospheres. Though $O_2$ is employed in this embodiment, other forms of oxidizing gases may be used.

Notably, a liner or sub-layer formed by HIPOX advantageously provides "corner rounding." Because oxidation kinetics proceeds faster at corners during HIPOX, as compared to conventional oxidation, a thicker barrier layer is obtained about the rim of trench 15. A thicker barrier about the rim reduces the probability of subthreshold voltage leakage of charge from an adjacent transistor.

Optionally, a nitrogen containing gas (e.g., $N_2O$ and NO) may be introduced in-situ into the HIPOX chamber to form layer 19. By in-situ it is meant without having to break vacuum in the chamber. Such nitrogen containing gas may be introduced during the formation of layer 19 or after the formation of layer 19. Layer 19 may be formed so that it contains about 0.1 to 3.5 percent nitrogen.

Thermal Oxidation

In the formation of layer 19 by thermal oxidation, $O_2$ is introduced; however, other forms of oxidizing gases (e.g., $O_3$) may be used. Temperature employed for this embodiment is about 800 to 1000 degrees Celsius for a furnace approach at about one atmosphere, and about 1000 to 1150 degrees Celsius for a rapid-thermal process (RTP) at about one atmosphere. As active area regions 30 are formed by the addition of impurities into substrate 11, thermal oxidation encroaches into active area regions 30 at edge 20 of trench 15. It will be appreciated by one of ordinary skill in the art of the present invention that such encroachment provides additional isolation of devices formed proximally near edge 20, as shown in FIG. 2.

Figure 2:
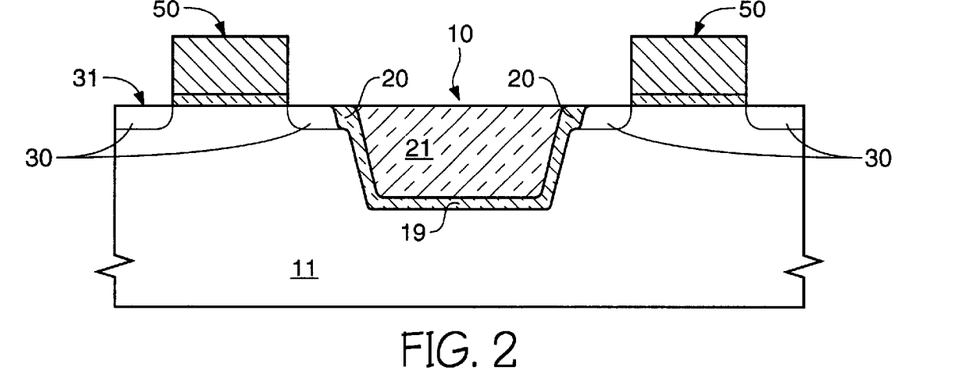
FIG. 2 is a cross-sectional view of an exemplary portion of a completed STI structure in accordance with the present invention.

Referring to FIG. 2, there is shown a cross-sectional view of STI structure 10 near "active areas" or conductive regions 30 formed in substrate 11 adjacent to transistors 50 in accordance with the present invention. Conventionally, such active areas are about 0.2 microns or less deep as measured from a top surface 31 of substrate 11. Thickness of layer 19 is at least 50 percent thicker adjacent to regions 30 as compared to its thickness elsewhere in trench 15. As conductive regions 30 are shallow with respect to depth of recesses 15, conductive regions 30 may be formed prior to formation of one or more recesses 15.

Figure 3:
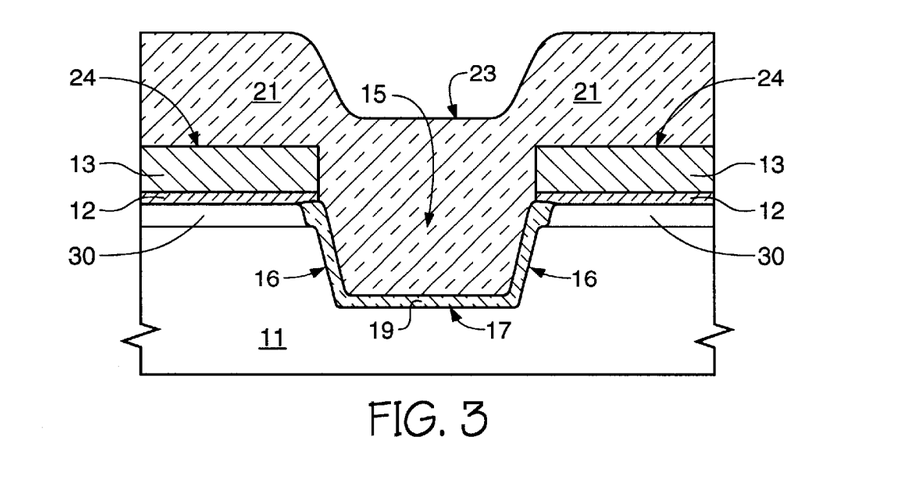
FIG. 3 is a cross-sectional view of an exemplary portion of the embodiment of the STI structure in FIG. 1 after filling with a dielectric material.

Referring to FIG. 3, there is shown a cross-sectional view of an exemplary portion of the embodiment of the STI structure in FIG. 1 after filling with layer 21. Layer 14 is removed in a conventional manner. Next, layer 21 may be formed of a doped or undoped silicon oxide. Some undoped silicon oxides include thermal TEOS and high-density plasma (HDP) silicon oxides. Some doped silicon oxides include PSG, BSG, BPSG, B-TEOS, P-TEOS, F-TEOS, silicon germanium oxide, and the like. In this embodiment, a sub-quarter micron trench 15 (as measured across bottom surface 17) was formed without partial filling facilitated by implant 18, so an HDP deposition was used to fill trench 15.

Figure 4:
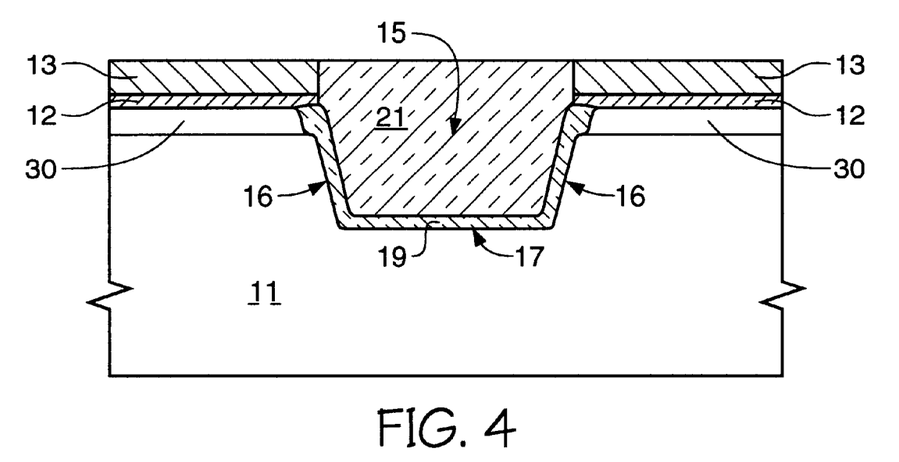
FIG. 4 is a cross-sectional view of an exemplary portion of the embodiment of the STI structure of FIG. 3 after planarization.

Layer 21 may subsequently be planarized by CMP, etch back, and the like, as illustratively shown in the cross-sectional view of FIG. 4. Accordingly, in this embodiment lower surface 23 (shown in FIG. 3) of layer 21 is 500 to 1000 angstroms above upper surface 24 (shown in FIG. 3) of layer 13, so a stop on layer 13 planarization process may be employed.

Figure 5:
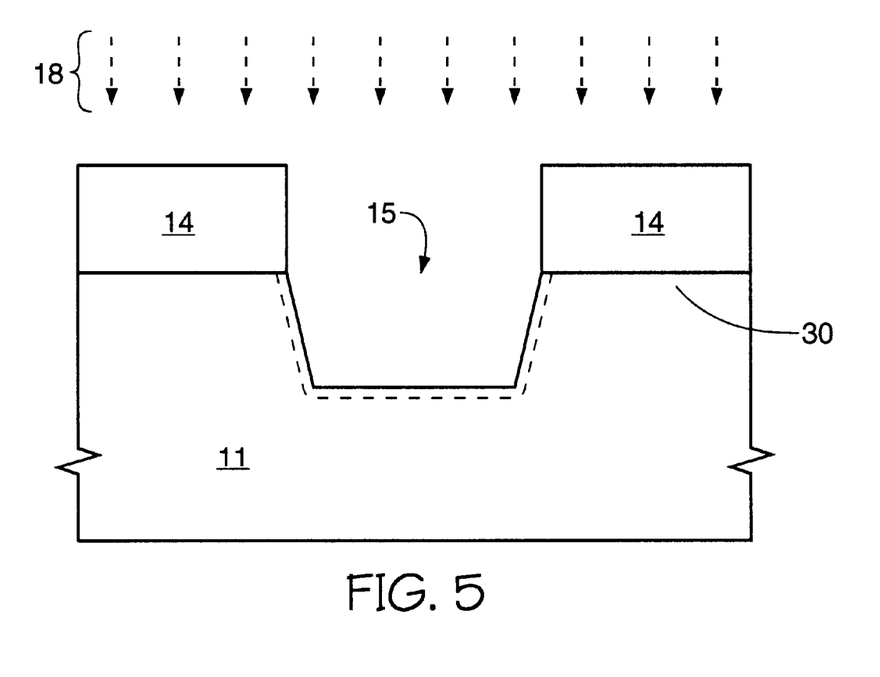
FIG. 5 is a cross-sectional view of an exemplary portion of an alterante embodiment of an in-process shallow trench isolation (STI) structure in accordance with the present invention.
Figure 6:
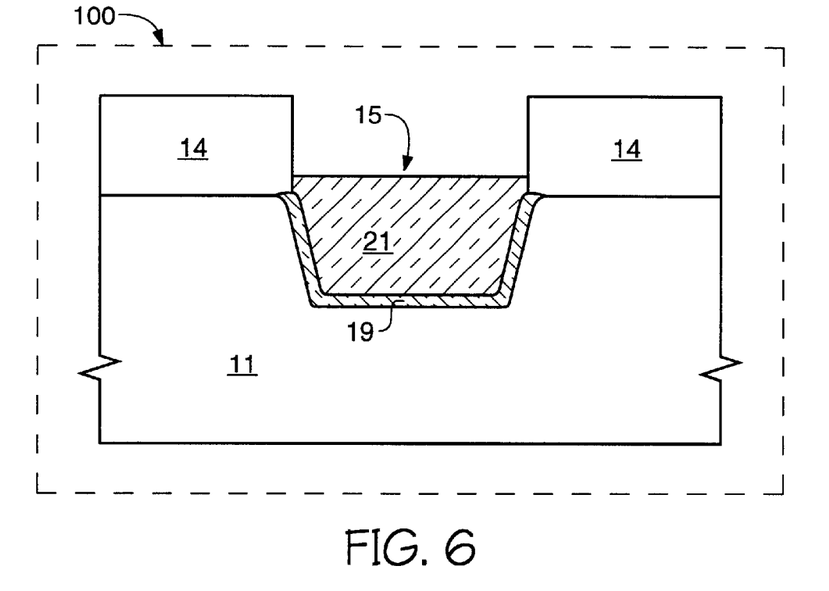
FIG. 6 is a cross-sectional view of an exemplary portion of the embodiment of the STI structure in FIG. 5 after filling with a dielectric material.

Alternatively, an STI structure in accordance with the present invention may be formed prior to formation of a gate oxide layer 12, as illustratively shown in the crosssectional views of FIGS. 5 and 6. With respect to FIGS. 5 and 6 in combination, layers 12 and 13 are omitted, and layer 14 is patterned on substrate 11 for forming trench 15. After trench 15 is etched, implant 18 may be used to facilitate at least a partial fill of trench 15 during the formation of layer 19 by HIPOX. $N_2O$, NO, $NH_3$, among other gases may be introduced into HIPOX chamber 100 to form layer 19. Owing to at least a partial filling of trench 15, trench 15 has an aspect ratio in which layer 21 may be thermally grown, deposited (such as by a chemical vapor deposition process), or grown by rapid thermal oxidation for filling a sub-quarter micron dimension trench. Moreover, layer 21 may be formed with HIPOX. If no partial filling is used, an HDP oxidation process may be preferred for filling trench 15.

Figure 7:
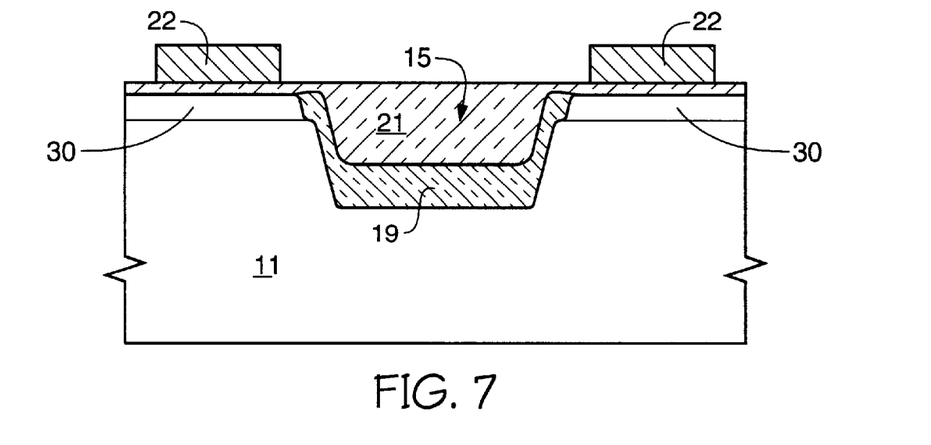
FIG. 7 is a cross-sectional view of an exemplary portion of the embodiment of the STI structure of FIG. 6 after planarization.

If desired, layer 21 may then be planarized down to be level with a top surface of substrate 11, or to a desired level extending above the top surface of substrate 11. Alternatively, layer 14 may be removed prior to formation of layer 21, as illustratively shown in the cross-sectional view of FIG. 7. In which embodiment, layer 21 may be planarized to a level extending above the top surface of substrate 11. A portion of layer 21 may then provide a gate dielectric for a transistor gate 22.

Formation of layer 19 or 21 may be followed by a high pressure anneal for purposes of densification. Such densification may be accomplished in-situ in a HIPOX chamber with respect to layer 19 formation; moreover, nitrogen containing gases may be supplied during a HIPOX anneal to affect electrical properties of layer 21. For a HIPOX anneal, temperature of at least about 650 degrees Celsius, preferably 850 to 1050 degrees Celsius, may be used, and pressure in a range of about 2 to 200 atmospheres, preferably 10 to 25 atmospheres. Alternatively, a thermal process may be used for densification, such as a rapid thermal process (RTP) with a temperature in a range of about 1000 to 1150 degrees Celsius at about one atmosphere or a furnace anneal with a temperature in a range of about 800 to 1000 degrees Celsius at about one atmosphere.

Densification may be employed to reduce the likelihood of a "seam" or "void" resulting from a bad or incomplete fill of trench 15, especially, as sub-layer 19 is of a sufficient quality to reduce the likelihood of dopants in layer 21 from diffusing to substrate 11.

Figure 8:
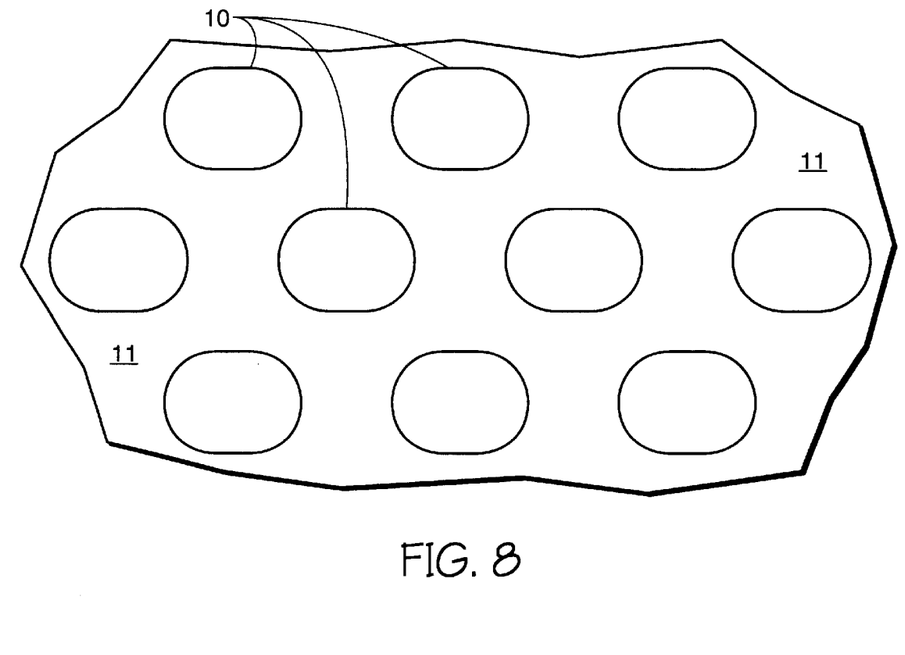
FIG. 8 is a top elevation view of a plurality of STI structures in accordance with the present invention.

The above-described the present invention is particularly suited to high-density integration, such as in a dynamic random access memory array with sub-quarter micron dimensions. In FIG. 8, there is shown a top elevation view of a plurality of STI structures 10 in accordance with the present invention.

The present invention has been particularly shown and described with respect to certain preferred embodiment(s). However, it will be readily appreciated to those of ordinary skill in the art that a wide variety of alternate embodiments, adaptations or variations of the preferred embodiment(s), and/or equivalent embodiments may be made without departing from the intended scope of the present invention as set forth in the appended claims. Accordingly, the present invention is not limited except as by the appended claims.

What is claimed is:

1. A process for forming an isolation structure having quarter (0.25) micron or smaller dimensions for enhanced electrical isolation of devices, the process comprising:
   providing a semiconductor layer;
   forming conductive regions in said semiconductor layer;
   forming a recess in said semiconductor layer between said conductive regions, said recess having a sidewall and a bottom surface, the bottom surface having a width as measured across the bottom surface of less than or equal to 0.25 microns;
   oxidizing at least a substantial portion of said semiconductor layer adjacent to said recess to provide a first dielectric layer, said first dielectric layer formed using high-pressure oxidation, said first dielectric layer encroaching into said conductive regions; and
   at least substantially filling said recess with at least a portion of a second dielectric layer,
   whereby the isolation structure having quarter micron or smaller dimensions is formed, said isolation structure providing enhanced electrical isolation and reducing the probability of subthreshold voltage transistor leakage.

2. A process, as in claim 1, wherein said first dielectric layer has a thickness of at least about 100 angstroms.

3. A process, as in claim 1, wherein said first dielectric layer has a thickness in a range of about 100 to 250 angstroms.

4. A process, as in claim 1, wherein said first dielectric layer adjacent to said conductive regions is thicker than said first dielectric layer elsewhere in said recess.

5. A process, as in claim 1, wherein said first dielectric layer adjacent to said conductive regions is at least 50 percent thicker than said first dielectric layer elsewhere in said recess.

6. A process, as in claim 1, further comprising using nitrogen to form said first dielectric layer.

7. A process, as in claim 6, wherein said first dielectric layer comprises 0.1 to 3.5 percent nitrogen.

8. A process, as in claim 1, wherein said first dielectric layer is a silicon oxide.

9. A process, as in claim 8, wherein said second dielectric layer is a doped silicon oxide.

10. A process, as in claim 8, wherein said second dielectric layer is an undoped silicon oxide.

11. A process, as in claim 1, wherein said high-pressure oxidation comprises:
    heating said semiconductor layer to a temperature of at least about 650 degrees Celsius; and
    exposing said semiconductor layer to a pressure in a range of about 2 to 200 atmospheres.

12. A process, as in claim 1, wherein said high-pressure oxidation comprises:
    heating said semiconductor layer to a temperature in a range of about 850 to 1050 degrees Celsius; and
    exposing said semiconductor layer to a pressure in a range of about 10 to 25 atmospheres.

13. A process, as in claim 1, further comprising annealing said first dielectric layer.

14. A process, as in claim 13, wherein said annealing comprises supplying a nitrogen containing gas to add nitrogen into said first dielectric layer.

15. A process, as in claim 13, wherein said second dielectric layer is formed using a high density plasma.

16. A process, as in claim 15, wherein said second dielectric layer is a doped oxide.

17. A process, as in claim 15, wherein said second dielectric layer is an undoped oxide.

18. A process, as in claim 15, further comprising annealing said second dielectric layer.

19. A process, as in claim 18, wherein said annealing is done in-situ with said high pressure oxidation.

20. A process, as in claim 15, further comprising densifying said second dielectric layer by high pressure oxidation.

21. A process, as in claim 20, further comprising planarizing said second dielectric layer to a level above said semiconductor layer.

22. A process, as in claim 21, further comprising forming a transistor gate oxide from a portion of said second dielectric layer.

23. A process, as in claim 1, wherein said second dielectric layer is a thermally deposited oxide.

24. A process, as in claim 23, further comprising densifying said second dielectric layer.

25. A process, as in claim 24, wherein said second dielectric layer is densified in-situ with said high pressure oxidation.

26. A process, as in claim 1, wherein the process is performed in the order presented.

27. A process for forming an isolation structure having quarter (0.25) micron or smaller dimensions, the process comprising:
    providing a substrate assembly;
    forming a plurality of recesses in said substrate assembly, each recess of said plurality having a bottom surface having a width, as measured across the bottom surface, of less than or equal to 0.25 microns;
    forming a first dielectric layer in said recesses using high-pressure oxidation; and
    forming a second dielectric layer extending into said recesses, whereby the isolation structure having quarter micron or smaller dimensions is formed, said isolation structure providing enhanced electrical isolation and reducing the probability of subthreshold voltage transistor leakage.

28. A process, as in claim 27, wherein said second dielectric layer is formed by using high-pressure oxidation.

29. A process, as in claim 28, wherein said second dielectric layer comprises nitrogen.

30. A process, as in claim 29, wherein said first dielectric layer is formed in-situ with said second dielectric layer.

31. A process, as in claim 27, wherein said second dielectric layer is formed using a high density plasma.

32. A process, as in claim 31, further comprising annealing said second dielectric layer.

33. A process, as in claim 27, further comprising densifying said second dielectric layer in a high pressure oxidation chamber.

34. A process, as in claim 27 wherein the process is performed in the order presented.

35. A process for forming a shallow trench isolation structure having quarter (0.25) micron and smaller dimensions, the process comprising:
   providing a substrate;
   forming a recess in said substrate, said recess having a sidewall and a bottom surface, the bottom surface having a width as measured across the bottom surface of less than or equal to 0.25 microns;
   implanting said recess;
   forming a first dielectric layer from said sidewall and said bottom surface using high-pressure oxidation; and
   forming a second dielectric layer extending into said recess,
whereby the isolation structure having quarter micron or smaller dimensions is formed, said isolation structure providing enhanced electrical isolation and reducing the probability of subthreshold voltage transistor leakage.

36. A process, as in claim 35, further comprising:
   polishing a surface of said second dielectric layer.

37. A process, as in claim 36, further comprising:
   forming a conductive layer on said polished surface of said second dielectric layer.

38. A process, as in claim 37, wherein a portion of said second dielectric layer forms a transistor gate oxide.

39. A process, as in claim 37, wherein a portion of said second dielectric layer forms a capacitor dielectric.

40. A process, as in claim 35, further comprising:
   densifying said second dielectric layer using high-pressure oxidation.

41. A process, as in claim 35, wherein said first dielectric layer is formed in-situ with said second dielectric layer.

42. A process, as in claim 35, wherein the process is performed in the order presented.

43. A process for forming a shallow trench isolation structure having quarter (0.25) micron or smaller dimensions between active areas formed in a substrate assembly, the process comprising:
   forming a recess between said active areas in said substrate assembly, said recess having a bottom surface having a width, as measured across the bottom surface, of less than or equal to 0.25 microns;
   forming a first dielectric layer is said recess using high-pressure oxidation to encroach into said active areas; and
   forming a second dielectric layer extending into said recess using high density plasma deposition,
whereby the isolation structure having quarter micron or smaller dimensions is formed, said isolation structure providing enhanced electrical isolation and reducing the probability of subthreshold voltage transistor leakage.

44. A process, as in claim 43, wherein said first dielectric layer is a silicon oxide formed on a sidewall and on a bottom surface in said recess.

45. A process, as in claim 42, wherein said second dielectric layer is deposited to fill said recess.

46. A process, as in claim 44, wherein said second dielectric layer is deposited to fill said recess and to extend above at least a portion of a transistor gate.

47. A process, as in claim 43, wherein the process is performed in the order presented.

48. A process for forming an isolation structure having quarter (0.25) micron and smaller dimensions for enhanced electrical isolation of devices, the process comprising:
   providing a semiconductor layer;
   forming conductive regions in said semiconductor layer;
   forming a recess in said semiconductor layer between said conductive regions, said recess having a sidewall and a bottom surface, the bottom surface having a width, as measured across the bottom surface, of less than or equal to 0.25 microns;
   oxidizing at least a substantial portion of said semiconductor layer adjacent to said recess to provide a first dielectric layer, said first dielectric layer formed using high-pressure oxidation, said first dielectric layer encroaching into said conductive regions;
   subjecting said first dielectric layer to a nitrogen containing gas at a time selected from the group consisting of during formation of said first dielectric layer and after formation of said first dielectric layer; and
   at least substantially filling said recess with at least a portion of a second dielectric layer,
whereby the isolation structure having quarter micron or smaller dimensions is formed, said isolation structure providing enhanced electrical isolation and reducing the probability of subthreshold voltage transistor leakage.

49. A process, as in claim 48, wherein the process is performed in the order presented.

50. A process, as in claim 48, wherein said first dielectric layer comprises 0.1 to 3.5 percent nitrogen.

51. A process for forming an isolation structure having quarter (0.25) micron and smaller dimensions for enhanced electrical isolation of devices, the process comprising:
   providing a semiconductor layer;
   forming conductive regions in said semiconductor layer;
   forming a recess in said semiconductor layer between said conductive regions, said recess having a sidewall and a bottom surface, the bottom surface having a width, as measured across the bottom surface, of less than or equal to 0.25 microns;
   oxidizing at least a substantial portion of said semiconductor layer adjacent to said recess to provide a first dielectric layer, said first dielectric layer formed using high-pressure oxidation at a temperature of at least about 650 degrees Celsius and a pressure in a range of about 2 to 200 atmospheres, said first dielectric layer encroaching into said conductive regions; and
   at least substantially filling said recess with at least a portion of a second dielectric layer,
whereby the isolation structure having quarter micron or smaller dimensions is formed, said isolation structure providing enhanced electrical isolation and reducing the probability of subthreshold voltage transistor leakage.

52. A process, as in claim 51, wherein the process is performed in the order presented.

53. A process for forming an isolation structure having quarter (0.25) micron or smaller dimensions for enhanced electrical isolation of devices, the process comprising:

provided a semiconductor layer;

forming conductive regions in said semiconductor layer;

forming a recess in said semiconductor layer between said conductive regions, said recess having a sidewall and a bottom surface, the bottom surface having a width, as measured across the bottom surface, of less than or equal to 0.25 microns;

oxidizing at least a substantial portion of said semiconductor layer adjacent to said recess to provide a first dielectric layer, said first dielectric layer formed using high-pressure oxidation at a temperature in a range of about 850 to 1050 degrees Celsius and a pressure in a range of about 10 to 25 atmospheres, said first dielectric layer encroaching into said conductive regions; and at least substantially filling said recess with at least a portion of a second dielectric layer, whereby the isolation structure having quarter micron or smaller dimensions is formed, said isolation structure providing enhanced electrical isolation and reducing the probability of subthreshold voltage transistor leakage.

54. A process, as in claim 53 wherein the process is performed in the order presented.

55. A process for forming an isolation structure having quarter (0.25) micron or smaller dimensions, the process comprising:

providing a substrate assembly;

forming a plurality of recesses in said substrate assembly each recess of said plurality of recesses having a bottom surface having a width, as measured across the bottom surface, of less than or equal to 0.25 microns;

forming a first dielectric layer in said recesses using high-pressure oxidation; and forming a second dielectric layer using high-pressure oxidation and extending into said recesses, whereby the isolation structure having quarter micron or smaller dimensions is formed, said isolation stricture providing enhanced electrical isolation and reducing the probability of subthreshold voltage transistor leakage.

56. A process, as in claim 55 wherein the process is performed in the order presented.

57. A process for forming a shallow trench isolation structure having quarter (0.25) micron or smaller dimensions, the process comprising:

providing a substrate;

forming a recess in said substrate, said recess having a sidewall and a bottom surface, the bottom surface having a width, as measured across the bottom surface, of less than or equal to 0.25 microns;

implanting said recess;

forming a first dielectric layer from said sidewall and said bottom surface using high-pressure oxidation;

forming a second dielectric layer extending into said recess; and densifying said second dielectric layer using high-pressure oxidation, whereby the isolation structure having quarter micron or smaller dimensions is formed, said isolation structure providing enhanced electrical isolation and reducing the probability of subthreshold voltage transistor leakage.

58. A process, as in claim 57, wherein the process is performed in the order presented.

* * * * *

UNITED STATES PATENT AND TRADEMARK OFFICE
CERTIFICATE OF CORRECTION

PATENT NO.   : 6,265,282 B1
DATED        : July 24, 2001
INVENTOR(S)  : Randhir P.S. Thakur and Richard Lane It is certified that error appears in the above-identified patent and that said Letters Patent is hereby corrected as shown below:

<u>Title page, Item [54], and Column 1, lines 1-2,</u>
Title, delete "PROCESS FOR MAKING AN ISOLATION STRUCTURE" and insert -- ISOLATION STRUCTURE AND PROCESS THEREFOR --.

<u>Column 5,</u>
Line 20, delete "the" after "above-described".

<u>Column 8,</u>
Line 8, delete referenced claim No. "42" and insert -- 44 --, therefor.

<u>Column 10,</u>
Line 6, delete "stricture" and insert -- structure --, therefor.

Signed and Sealed this

Thirtieth Day of April, 2002

*Attest:*

*Attesting Officer*

JAMES E. ROGAN
*Director of the United States Patent and Trademark Office*